(12) United States Patent
Yu et al.

(10) Patent No.: US 11,965,236 B2
(45) Date of Patent: Apr. 23, 2024

(54) METHOD OF FORMING NICKEL SILICIDE MATERIALS

(71) Applicant: APPLIED MATERIALS, INC., Santa Clara, CA (US)

(72) Inventors: Minrui Yu, San Jose, CA (US); He Ren, San Jose, CA (US); Mehul Naik, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 303 days.

(21) Appl. No.: 16/511,627

(22) Filed: Jul. 15, 2019

(65) Prior Publication Data
US 2020/0024722 A1    Jan. 23, 2020

Related U.S. Application Data

(60) Provisional application No. 62/699,502, filed on Jul. 17, 2018.

(51) Int. Cl.
| | |
|---|---|
| *C23C 14/56* | (2006.01) |
| *C23C 14/06* | (2006.01) |
| *C23C 14/54* | (2006.01) |
| *C23C 14/58* | (2006.01) |
| *H01J 37/34* | (2006.01) |
| *H01L 21/285* | (2006.01) |

(52) U.S. Cl.
CPC ........ *C23C 14/0682* (2013.01); *C23C 14/542* (2013.01); *C23C 14/56* (2013.01); *C23C 14/5806* (2013.01); *H01J 37/3429* (2013.01); *H01L 21/28556* (2013.01)

(58) Field of Classification Search
CPC ... C23C 14/0682; C23C 14/56; C23C 14/046; C23C 14/024; C23C 14/35; C23C 14/5806; C23C 14/345; C23C 14/568; H01L 21/28518; H01L 21/32053; H01L 21/2855; H01L 21/76898; H01L 21/76876; H01L 21/76879; H01L 21/76843; H01L 23/53271; H01J 37/3411; H01J 37/3488
USPC ........................ 204/192.17, 298.25; 118/719
See application file for complete search history.

(56) References Cited

U.S. PATENT DOCUMENTS

| | | | |
|---|---|---|---|
| 7,432,184 B2 * | 10/2008 | Hosokawa | ........ H01L 21/67196 257/E21.414 |
| 9,613,859 B2 | 4/2017 | Lakshmanan et al. | |
| 10,388,533 B2 | 8/2019 | Ren et al. | |

(Continued)

FOREIGN PATENT DOCUMENTS

| | | |
|---|---|---|
| JP | 2010016102 A | 1/2010 |
| WO | WO 2018/231780 | 12/2018 |

OTHER PUBLICATIONS

International Search Report and Written Opinion for PCT/US2019/041928, dated Oct. 31, 2019.

*Primary Examiner* — Rodney G McDonald
(74) *Attorney, Agent, or Firm* — MOSER TABOA (57) ABSTRACT

Methods for forming a nickel silicide material on a substrate are disclosed. The methods include depositing a first nickel silicide seed layer atop a substrate at a temperature of about 15° C. to about 27° C., annealing the first nickel silicide seed layer at a temperature of 400° C. or less such as over 350° C.; and depositing a second nickel silicide layer atop the first nickel silicide seed layer at a temperature of about 15° C. to about 27° C. to form the nickel silicide material.

19 Claims, 5 Drawing Sheets

(56) References Cited

U.S. PATENT DOCUMENTS

| | | | |
|---|---|---|---|
| 2003/0207503 A1* | 11/2003 | Yamazaki | H01L 27/1214 |
| | | | 257/E21.414 |
| 2006/0043484 A1 | 3/2006 | Cabral, Jr. et al. | |
| 2006/0130746 A1 | 6/2006 | Terashima et al. | |
| 2007/0048992 A1 | 3/2007 | Hosokawa et al. | |
| 2007/0166074 A1 | 7/2007 | Hosokawa et al. | |
| 2008/0090369 A1* | 4/2008 | Akiyama | H01L 29/66636 |
| | | | 438/308 |
| 2011/0124192 A1 | 5/2011 | Ganguli et al. | |
| 2011/0237061 A1 | 9/2011 | Yamaguchi et al. | |
| 2013/0171465 A1 | 7/2013 | Jin et al. | |
| 2015/0093891 A1 | 4/2015 | Zope et al. | |
| 2015/0228777 A1* | 8/2015 | Zhang | H01L 29/66772 |
| | | | 257/347 |
| 2016/0126134 A1* | 5/2016 | Shaviv | H01L 21/76843 |
| | | | 204/267 |
| 2016/0204027 A1 | 7/2016 | Lakshmanan et al. | |
| 2019/0311908 A1 | 10/2019 | Ren et al. | |

\* cited by examiner

METHOD OF FORMING NICKEL SILICIDE MATERIALS

CROSS-REFERENCE TO RELATED APPLICATIONS

This application claims priority to U.S. Provisional Application Ser. No. 62/699,502 filed on 17 Jul. 2018 herein entirely incorporated by reference.

FIELD

Embodiments of the present disclosure generally relate to a methods of depositing nickel silicide (NiSi) materials having improved conductivity, or low resistivity, and/or an electron mean free path (eMFP) of less than 10 nanometers (nm).

BACKGROUND

In semiconductor devices, such as integrated circuits, interconnections are used to connect and integrate the various components of the device. Typically, the devices are composed of many layers of conductive components, separated by an insulating material to help minimize signal paths and reduce the size of the device. To establish continuity between the layers, a conductive interconnection (contact or via) extends between the insulating layers and connects the conductive layers. Thus, an interconnection is a vertical opening filled with conductive material used to connect components on various layers of a device to one another and to the semiconducting substrate.

As the integration of semiconductor devices increases, the sizes of interconnections have been reduced and their aspect ratios (i.e., the ratio of the height of the interconnection to the width) have increased. As a result, methods that in the past were sufficient to fill the interconnections have proved insufficient for the smaller interconnections. Typically, interconnection apertures are filled using a metal material, such as copper, that is deposited inside the apertures by chemical vapor deposition (CVD), physical vapor deposition (PVD), electroplating, or a combination thereof.

Interconnects in integrated circuits (ICs) distribute clock and other signals and provide power/ground to various parts within the circuit. With the continued scaling down of IC feature sizes, interconnects are becoming the dominant factor in determining system performance, e.g. signal propagation delays, and power dissipation, which relate to interconnect line resistance. Over the past 20 years, copper (Cu) has been the material of choice for interconnects because of the low resistivity of Cu. However, the inventors have observed that as interconnect line widths shrink to below electron mean free path (eMFP) of a material, the effective resistivity of the material is increased as a result of side-wall electron scattering at line surface and grain boundaries. Therefore, the inventors have observed the increase of effective resistivity is problematic for Cu interconnects with a width of 20 nm or below, as Cu has an eMFP of 39 nm. In addition, the inventors have observed copper can problematically interact with silicon at low temperatures or diffuse into surrounding dielectrics. A barrier layer is usually needed to prevent the diffusion, which will detrimentally contribute to the overall resistivity of the Cu. The inventors have observed a need to find a replacement material for copper in IC interconnects.

Therefore, the inventors have provided improved methods for forming a nickel silicide material on a substrate, and methods of lowering the resistivity of a nickel silicide material.

SUMMARY

Embodiment of forming a nickel silicide material on a substrate, and lowering the resistivity of a nickel silicide material are provided herein. In some embodiments, a method for forming a nickel silicide material on a substrate includes: depositing a first nickel silicide seed layer atop a substrate at a temperature of about 15° C. to about 27° C.; annealing the first nickel silicide seed layer at a temperature such as over 350° C., or 400° C. or less; and depositing a second nickel silicide layer atop the first nickel silicide seed layer at a temperature of about 15° C. to about 27° C. to form the nickel silicide material. In embodiments, the nickel silicide material has a resistance in an amount of less than 20 micro ohm×cm, such as 1-20 μΩ·cm.

In some embodiments, a method of lowering the resistivity of a nickel silicide material includes: a) depositing a nickel silicide layer atop a substrate at a temperature of about 15° C. to about 27° C.; b) annealing the first nickel silicide seed layer at a temperature over 350° C.; and c) repeating a), or a) and b) until the nickel silicide material has a predetermined thickness. In some embodiments, annealing the first nickel silicide seed layer occurs at a temperature of 400° C. or less in argon for up to 2 minutes. In some embodiments, upon reaching the desired thickness of the nickel silicide material, the nickel silicide material is annealed at a temperature of about 350° C., and a pressure of 20 bar (argon gas environment) for up to 10 minutes.

In some embodiments, a method of forming an interconnection on a substrate, includes: physical vapor depositing a first nickel silicide seed layer on a substrate at a temperature of about 15° C. to about 27° C.; annealing the first nickel silicide seed layer at a temperature over 350° C.; and physical vapor depositing a second nickel silicide layer atop the first nickel silicide seed layer at a temperature of about 15° C. to about 27° C. to form a nickel silicide material.

In some embodiments, the present disclosure relates to a substrate processing system, including: a physical vapor depositing chamber configured for physical vapor depositing a first nickel silicide seed layer on a substrate at a temperature of about 15° C. to about 27° C., and physical vapor depositing a second nickel silicide layer atop the first nickel silicide seed layer at a temperature of about 15° C. to about 27° C. to form a nickel silicide material; and a thermal processing chamber configured for annealing the first nickel silicide seed layer at a temperature over 350° C.

In some embodiments, the present disclosure relates to a computer readable medium, having instructions stored thereon which, when executed, cause an integrated system to perform a method of forming a nickel silicide material on a substrate including: depositing a first nickel silicide seed layer atop a substrate at a temperature of about 15° C. to about 27° C.; annealing the first nickel silicide seed layer at a temperature over 350° C.; and depositing a second nickel silicide layer atop the first nickel silicide seed layer at a temperature of about 15° C. to about 27° C. to form the nickel silicide material.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of forming a nickel silicide material on a substrate are provided herein. The inventors have observed that the increase of effective resistivity is problematic for copper (Cu) interconnects with a width of 20 nm or below, as Cu has an eMFP of 39 nm. In addition, the inventors have observed copper is problematic in that copper interacts with silicon at low temperatures or diffuses into surrounding dielectrics. A barrier layer is usually needed to prevent the Cu diffusion, which will detrimentally contribute to the overall resistivity of the Cu. The inventors have observed a need to find a replacement material for copper in IC interconnects. Embodiments of the inventive methods may advantageously provide continuous coverage of surfaces of a substrate including a blanketed substrate surface or e.g., a high aspect ratio feature with nickel silicide (NiSi) materials having improved conductivity, or low resistivity, and/or an eMFP of less than 10 nanometers (nm).

Figure 1:
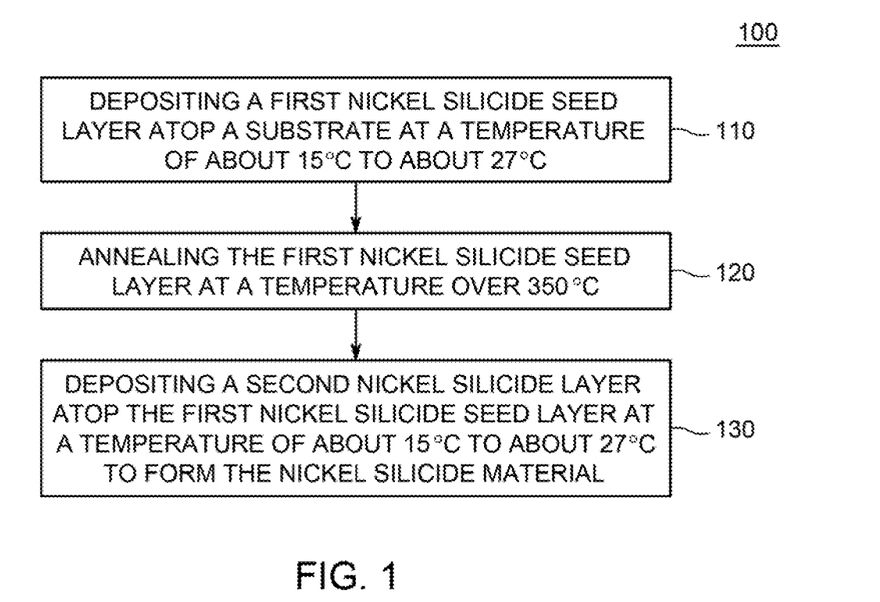
FIG. 1 depicts a flow chart of a method for processing a substrate in accordance with some embodiments of the present disclosure.
Figure 2A:
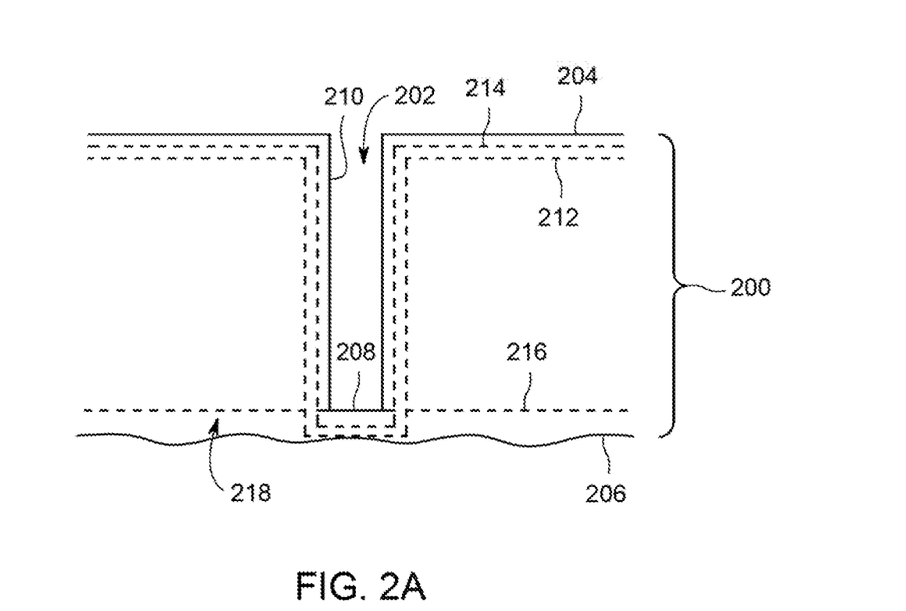
FIGS. 2A-D depicts the stages of filling a high aspect ratio opening in accordance with some embodiments of the present disclosure.
Figure 2B:
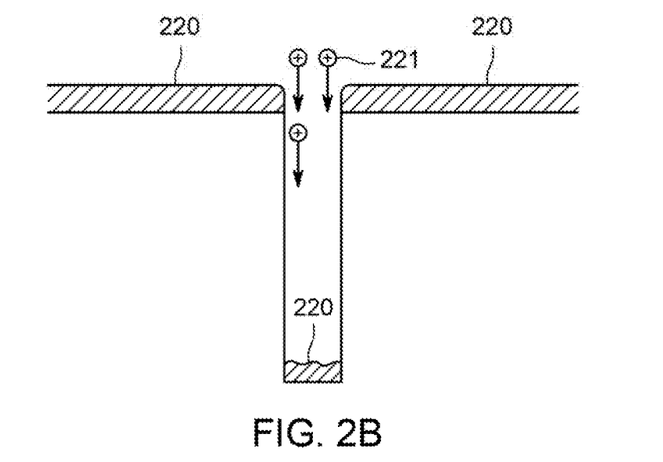
Figure 2C:
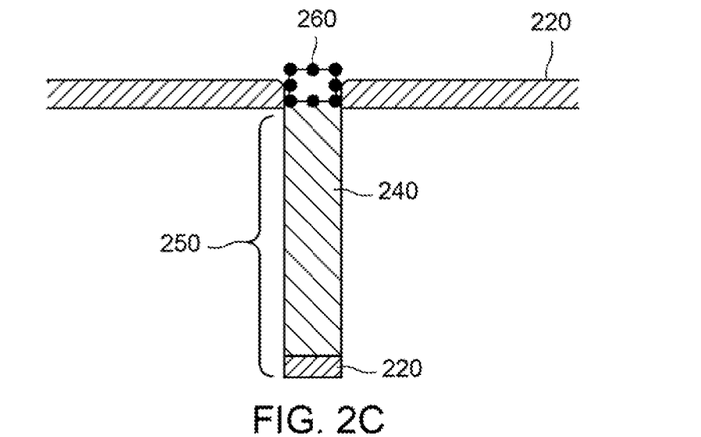

FIG. 1 depicts a flow chart of a method 100 for forming a nickel silicide material on a substrate 200 in accordance with some embodiments of the present disclosure. The method 100 is illustratively described below with respect to the stages of filling a high aspect ratio feature as depicted in FIGS. 2A, 2B and 2C. However, a nickel silicide material may be formed as a sheet or blanket upon or atop a substrate, e.g., without having features such as a high aspect ratio feature. In some embodiments, nickel silicide material may be formed as a sheet or blanket on a substrate and subjected to additional process flows such as etching, filling and/or capping. The method 100 may be performed in any suitable PVD process chamber having both pulsed-DC and radio frequency (RF) power sources, such as a process chamber 300 described below and depicted in FIG. 3.

Figure 3:
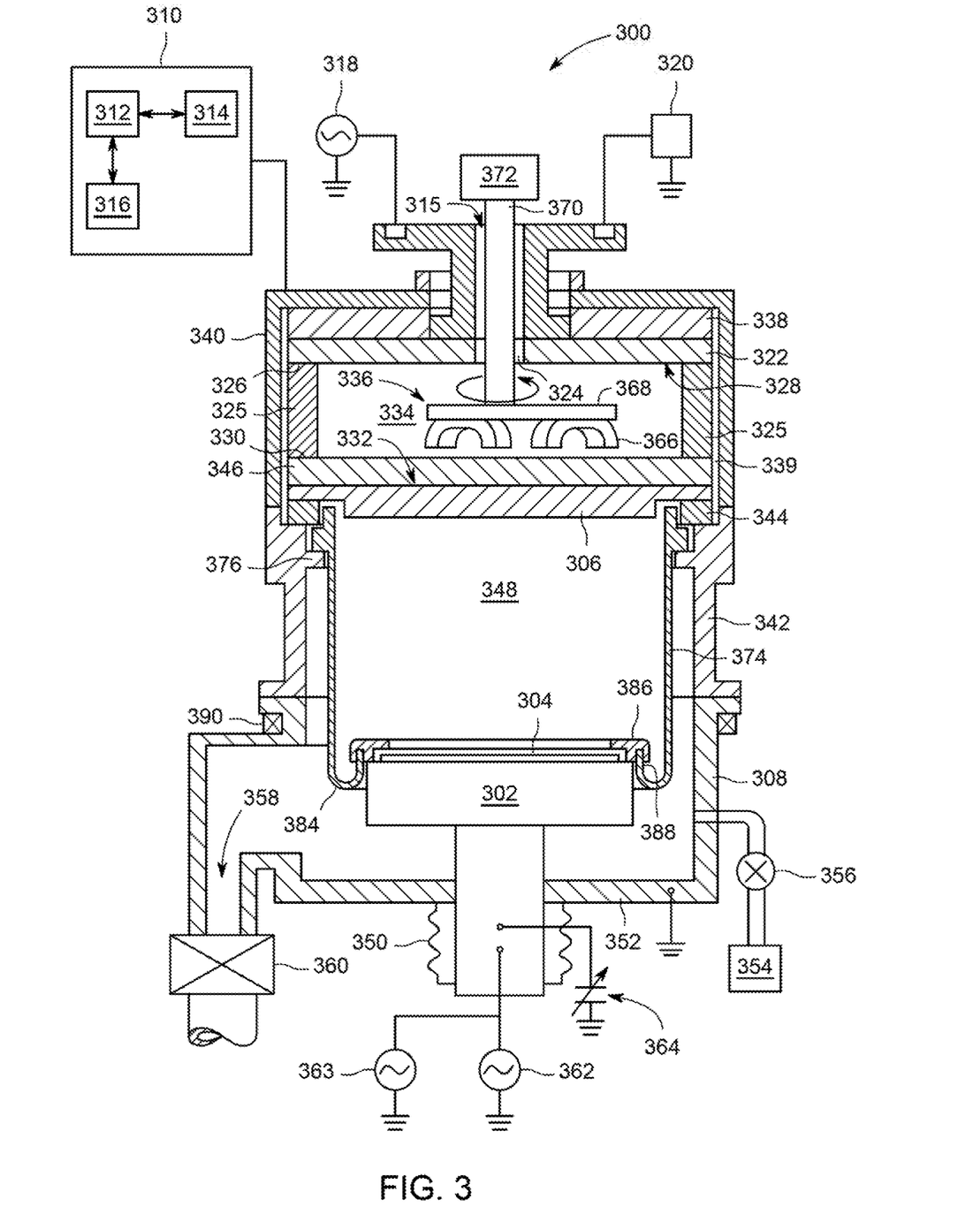
FIG. 3 depicts a schematic, cross-sectional view of a physical vapor deposition (PVD) chamber in accordance with some embodiments of the present disclosure.

The method 100 begins at 110 by depositing a first nickel silicide seed layer 220 atop a substrate 200 at a temperature such as room temperature or of about 15° C. to about 27° C., or about 20° C. to 25° C. For example, a substrate 200 (shown in FIG. 2A) may be provided to a PVD chamber, such as process chamber 300 (FIG. 3). In embodiments, the substrate 200 includes a high aspect ratio opening such as opening 202 formed in a first surface 204 of the substrate 200 and extending into the substrate 200 towards an opposing second surface 206 of the substrate 200. The substrate 200 may be any suitable substrate including, but not limited to a substrate having a high aspect ratio opening formed thereon. For example, the substrate 200 may comprise one or more of silicon (Si), silicon oxide ($SiO_2$), silicon nitride (SiN), or other dielectric materials. In embodiments, the substrate may comprise a thin metal layer such as titanium nitride (TiN), tantalum nitride (TaN), or others. In addition, the substrate 200 may include additional layers of materials or may have one or more completed or partially completed structures formed therein or thereon.

The opening 202 may be any opening having a high aspect ratio, such as used to form a via, trench, dual damascene structure, or the like. In some embodiments, the opening 202 may have a height to width aspect ratio of at least about 5:1 (e.g., a high aspect ratio). For example, in some embodiments, the aspect ratio may be about 10:1 or greater, such as about 15:1, or more. The opening 202 may be formed by etching the substrate using any suitable etch process. The opening 202 includes a bottom surface 208 and sidewalls 210 as shown.

In some embodiments, the bottom surface 208 and the sidewalls 210 may be covered with one or more layers prior to depositing nickel silicide atoms as described below. For example, and as shown by dotted lines in FIG. 2A, the bottom surface and sidewalls of the opening 202 and the first surface of the substrate 200 may be covered by a dielectric layer or an oxide layer 212, such as silicon oxide ($SiO_2$), (Si), (SiN), or other dielectric materials. The oxide layer may be deposited or grown, for example in a chemical vapor deposition (CVD) chamber or in an oxidation chamber, prior to providing the substrate 200 to a PVD chamber. A dielectric layer or an oxide layer 212 may serve as an electrical and/or physical barrier between the substrate and a nickel silicide-containing layer to be subsequently deposited in the opening, and/or may function as a better surface for attachment during the deposition process discussed below than a native surface of the substrate. In embodiments, materials other than oxides may be substituted for oxide layer 212.

In some embodiments, a barrier layer 214 may be deposited atop the oxide layer 212 (as shown), or atop a dielectric layer, or atop the bottom surface and sidewalls of the opening and the first surface of the substrate if an oxide layer is not present. The barrier layer 214 may serve a similar purpose as either a dielectric layer or the oxide layer 212 discussed above. In some embodiments, the barrier layer 214 may include at least one of titanium (Ti), titanium nitride (TiN), tantalum (Ta), tantalum nitride (TaN), or others. The barrier layer 214 may be deposited by any suitable methods, such as by CVD or PVD, including by using the method 100 described below to form a continuous barrier layer in the opening 202.

Figure 2D:
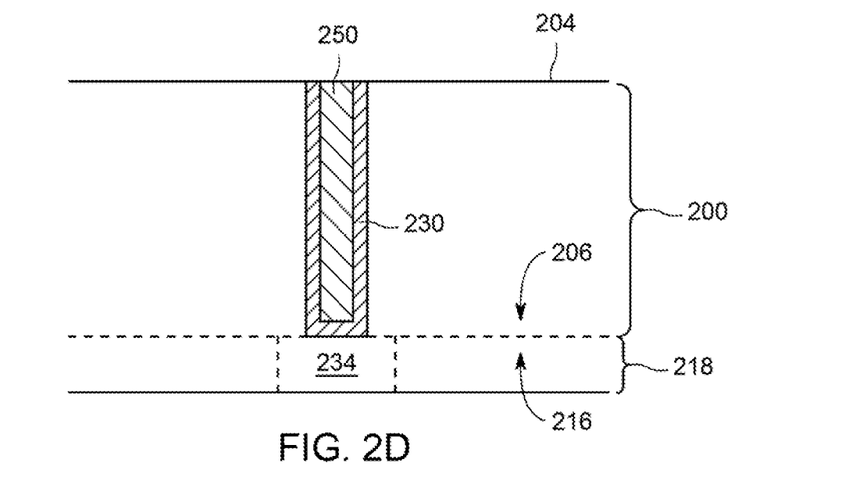

In some embodiments, and as illustrated in phantom in FIG. 2A, the opening 202 may extend completely through the substrate 200 and a surface 216 of a second substrate 218 may form the bottom surface 208 of the opening 202. The second substrate 218 may be disposed adjacent to the second surface 206 of the substrate 200. Further (as shown in FIG. 2D and discussed below), a device, such as a logic device or the like, or a portion of a device requiring electrical connectivity, such as a gate, a contact pad, a conductive via, or the like, may be disposed in the surface 216 of the second substrate 218 and aligned with the opening 202.

At 110, the deposition of a first nickel silicide seed layer atop a substrate 200 may occur in a PVD chamber where RF power (such as from an RF power source 318, described below) is applied at a VHF frequency to a target comprising nickel silicide disposed above the substrate 200 to form a plasma from a plasma-forming gas. For example, the target may be the target 306 discussed below. Further, the target may comprise one or more of nickel silicide alloys, or the like, suitable for forming a first nickel silicide seed layer 220 on the surfaces of the opening 202 and the first surface 204 of the substrate 200. For example, the target may comprise one or more of nickel, silicon, or nickel silicide in a ratio of 1±x:1 (x=0.01 to 0.1). Other constituents such as metals may be present in an amount of less than 5% weight of the total target weight such as titanium (Ti), tantalum (Ta), copper (Cu), aluminum (Al), or the like. The plasma-forming gas may include an inert gas, such as a noble gas, or other inert gas. For example, non-limiting examples of suitable plasma-forming gases may include argon (Ar), helium (He), xenon (Xe), neon (Ne), hydrogen ($H_2$), or the like. In embodiments, the plasma-forming gas is Ar having a flow rate of about 5-15 sccm, such as 10 sccm, 11 sccm, or 12 sccm.

At 110, the deposition of a first nickel silicide seed layer 220 atop a substrate 200 may occur in a PVD chamber where RF power may be applied at a VHF frequency for one or more of forming the plasma from the plasma-forming gas and ionizing metal atoms sputtered from the target by the plasma. As used herein, a VHF frequency is a frequency in the range of from about 27 MHz to about 100 MHz. In some embodiments, the VHF frequency applied is about 60 MHz. For example, increasing the VHF frequency may increase the plasma density and/or the amount of ionization in nickel silicide atoms sputtered from the target. In some embodiments, RF power may be applied at a 0.5 to 3 kW, such as 1 kW, 2 kW, or 3 kW.

At 110, the deposition of a first nickel silicide seed layer atop a substrate 200 may occur in a PVD chamber where a pulsed-DC power may be applied to the target 306 to direct the plasma towards the target 306, for example, from a pulsed-DC power source 320 coupled to the target 306 as described below. The DC power may range from about 1 to about 4 kilowatts (kW). In some embodiments, the pulsed-DC power may be about 1-4 kW, or approximately 2 kW, 3 kW, or 4 kW. In embodiments, pulsed-DC power is applied to lower the resistivity of the first nickel silicide seed layer 220. The pulsed-DC power may be adjusted to control the deposition rate of sputtered nickel silicide atoms on the substrate 200. For example, increasing the pulsed-DC power can result in increased interaction of the plasma with the target and increased sputtering of nickel silicide atoms from the target 306, or increase nickel silicide grain size.

At 110, the deposition of a first nickel silicide seed layer atop a substrate 200 may occur in a PVD chamber where, nickel silicide atoms are sputtered from the target 306 using the plasma while maintaining a first pressure in the PVD chamber sufficient to ionize a predominant portion of nickel silicide atoms being sputtered from the target. For example, a predominant portion of nickel silicide atoms may range from about 30 to about 70 percent of the total number of nickel silicide atoms being sputtered by the plasma. The first pressure, in addition to the first RF power and the pulsed-DC power applied, may be dependent on process chamber geometry (such as substrate size, target to substrate distance, and the like). For example, the first pressure may range from about 0.2 to about 100 millitorr (mTorr) in a chamber configured with a target to substrate gap of about 60 to 90 millimeters (mm). In some embodiments, the first pressure is about 0.5 to about 5 mTorr, or 0.5 mT. The first pressure in the chamber may be maintained by the flow rate of the plasma-forming gas and/or the flow rate of an additional gas, such as an inert gas, which may be co-flowed with the plasma-forming gas. The first pressure may provide a high density of gas molecules between the target and the substrate with which sputtered nickel silicide atoms may collide and be ionized. Pressure may be additionally utilized to control the amount of ionization of nickel silicide atoms sputtered from the target 306. For example, increasing pressure in the target 306 to substrate gap may increase the number of collisions with metal atoms and increase the amount of ionized nickel silicide atoms.

At 110, in one embodiment, the deposition of a first nickel silicide seed layer 220 atop a substrate 200 may occur in a PVD chamber under Ar plasma, at a flow of about 11 sccm, having a process pressure of about 0.5 mT, at power of 1-4 kW pulsed-DC or about 1 kW RF. At 110, in one embodiment, the deposition of a first nickel silicide seed layer 220 atop a substrate 200 may occur in a PVD chamber under Ar plasma, at a flow of 11 sccm, having a process pressure of 0.5 mT, at power of 1-4 kW pulsed-DC.

At 110, the deposition of a first nickel silicide seed layer 220 atop a substrate 200 may occur in a PVD chamber where a first plurality of nickel silicide atoms 221 are deposited on the first surface 204 of the substrate 200 and on the bottom surface 208 of the opening 202 as illustrated in FIG. 2B. The first plurality of nickel silicide atoms 221 may be deposited using the processing conditions discussed above, such as the first pressure, first RF power, pulsed-DC power, and/or the VHF or RF frequency. Such processing conditions can facilitate the direction of the first plurality of nickel silicide atoms 221 approximately perpendicular to substrate 200 as illustrated in FIG. 2B. In some embodiments, an optional RF power may be applied to the substrate 200 (e.g., to an electrode disposed beneath the substrate 200, such as within the substrate support) during the deposition of the first plurality of nickel silicide atoms 221. The RF power (also referred to as an RF bias power) may be applied at a frequency ranging from about 0.5 to about 13.56 MHz and at a power of up 50 W or about 5 to 50 W. In some embodiments, the frequency of the RF bias power may be about 2 MHz, or about 13.56 MHz, or both if another RF power source is additionally coupled a substrate support pedestal of the PVD chamber (or an electrode contained therein). The optional RF bias power provided while depositing the first plurality of nickel silicide atoms 221 may be small to minimize energy of the depositing nickel silicide atoms.

In some embodiments, at 110, a first RF power (also referred to herein as a first RF bias power) is applied to an electrode disposed beneath the substrate 200 to redistribute at least some of the first plurality of nickel silicide atoms from the bottom surface 208 of the opening 202 to the sidewalls 210 of the opening 202. The first RF bias power may be applied at a frequency ranging from about 2 to about 13.56 MHz. For example, in some embodiments, the frequency of the first RF bias power may be about 2 MHz, or 13.56 MHz, or both if an optional second RF bias power source (second RF bias power source 363 illustrated in FIG. 3) is additionally coupled a substrate support pedestal 302 as shown in FIG. 3 and described below. The first RF bias power may be utilized to increase ion energy and/or angle of incidence of ions incident on the substrate 200. For example, the ions incident on the substrate 200 may include ionized nickel silicide atoms, ionized elements from the plasma, or a combination thereof. The first RF bias power may be increased to increase ion energy for example, to increase the impact of ions on the deposited nickel silicide atoms on the bottom surface 208 of the opening 202 as illustrated in FIG. 2B. The increased impact of ions on the bottom surface 208 of the opening can facilitate redistribution of at least some of the first plurality of metal atoms onto the sidewalls 210 as shown. The first RF bias power may be substantially greater than the optional RF bias power applied during the deposition of the first plurality of nickel silicide atoms 221 as discussed above. For example, the first RF bias power may be greater than about 50 W, or range from about 0 to about 200 W. In some embodiments, the first RF bias power is about 50 W.

In some embodiments, where the first RF bias power and a second RF bias power are utilized concurrently, the first RF bias power may be used to control ion energy proximate the substrate 200 and a second RF bias power may be used to control a distribution in the ion energy proximate the substrate 200.

In some embodiments, at 110, the temperature for depositing the first nickel silicide seed layer is room temperature, or about 20° C. to about 25° C., 22° C., 23° C., 24° C., or 25° C.

In some embodiments, at 110, the first nickel silicide seed layer 220 is formed to a predetermined thickness. In embodiments, the thickness of the first nickel silicide seed layer 220 is about 10 angstrom to 100 angstrom, 20 angstrom to 60 angstrom, 30 angstrom to 50 angstrom, 35 angstrom to 45 angstrom, about 20 angstrom, about 25 angstrom, about 30 angstrom, about 35 angstrom, about 40 angstrom, about 50 angstrom, about 60 angstrom. In embodiments, the thickness of the first nickel silicide seed layer 220 is about 30 to 70 percent of total nickel silicide thickness, for example, 50 angstrom out of a total thickness of 100 angstrom nickel silicide film.

In some embodiments, at 110, the first nickel silicide seed layer 220 is characterized as polycrystalline.

Referring back to FIG. 1, at 120, in embodiments, e.g., subsequent to the formation of a first nickel silicide seed layer 220 atop a substrate 200, annealing, such as in situ annealing of the first nickel silicide seed layer 220 is performed at a temperature over 350° C. In embodiments, e.g., subsequent to the formation of a first nickel silicide seed layer 220 atop a substrate 200, annealing, such as in situ annealing of the first nickel silicide seed layer 220 is performed at a temperature of 400 degrees or less. For example, annealing may be performed on of the first nickel silicide seed layer 220 at a temperature of about 355° C. to 400° C., 375° C. to 405° C., or about 400° C. In embodiments, the post-deposition anneal, such as rapid thermal anneal (RTA), or dynamic surface anneal (DSA), makes the seed grain of the first nickel silicide seed layer 220 atop substrate 200 larger and in embodiments, longer along a longitudinal direction. In some embodiments, the anneal can be performed at the above mentioned temperatures for a duration sufficient to increase the grain size of the seed grain of the first nickel silicide seed layer 220, such as to a sufficient size, or predetermined size such as 200 nanometer, 1 micrometer, or larger. In some embodiments, the anneal can be performed at the above mentioned temperatures for a duration sufficient to increase the grain size of the seed grain of the first nickel silicide seed layer 220, such as to a sufficient size, or predetermined size such as 200 nanometer, 1 micrometer, or larger along a horizontal central axis, vertical central axis, and/or longitudinal central axis. In embodiments, the substrate 200 may be moved to a chamber suitable for annealing such as in a thermal processing chamber, or annealing may be in situ such as in an integrated system including a thermal processing chamber where the transfer between chambers is performed under vacuum.

In some embodiments, subsequent to annealing, substrate 200 is allowed to cool to a lower temperature such as room temperature.

Referring back to FIG. 1, at 130, in embodiments, depositing a second nickel silicide layer 240 atop the first nickel silicide seed layer 220 is performed at a temperature of about 15° C. to about 27° C. to form the nickel silicide material 250. In embodiments, the conditions of the deposition 130 are the same as the conditions relating to 110 above. For example, at 130, the deposition of a second nickel silicide layer atop the first nickel silicide seed layer 220 may occur in a PVD chamber where, nickel silicide atoms are sputtered from the target 306 using the plasma while maintaining a first pressure in the PVD chamber sufficient to ionize a predominant portion of nickel silicide atoms being sputtered from the target. In one embodiment, the deposition of a second nickel silicide layer 240 atop a first nickel silicide seed layer 220 may occur in a PVD chamber under Ar plasma, at a flow of about 11 sccm, having a process pressure of about 0.5 mT, at power of 1-4 kW pulsed-DC or about 1 kW RF. At 130, in one embodiment, the deposition of a second nickel silicide layer 240 atop a first nickel silicide seed layer 220 may occur in a PVD chamber under Ar plasma, at a flow of 11 sccm, having a process pressure of 0.5 mT, at power of 1-4 kW pulsed-DC. In embodiments, at 130, a predominant portion of nickel silicide atoms may range from about 30 to about 70 percent of the total number of nickel silicide atoms being sputtered by the plasma. The first pressure, in addition to the first RF power and the pulse-DC power applied, may be dependent on process chamber geometry (such as substrate size, target to substrate distance, and the like). For example, the first pressure may range from about 0.5 to about 140 milliTorr (mT) in a chamber configured with a target to substrate gap of about 60 to 90 millimeters (mm). In some embodiments, the first pressure is about 0.5 mTorr. The first pressure in the chamber may be maintained by the flow rate of the plasma-forming gas and/or the flow rate of an additional gas, such as an inert gas, which may be co-flowed with the plasma-forming gas. The first pressure may provide a high density of gas molecules between the target and the substrate with which sputtered nickel silicide atoms may collide and be ionized. Pressure may be additionally utilized to control the amount of ionization of nickel silicide atoms sputtered from the target 306. For example, increasing pressure in the target 306 to substrate gap may increase the number of collisions with metal atoms and increase the amount of ionized nickel silicide atoms.

At 130, the deposition of a second nickel silicide layer 240 atop a the first nickel silicide seed layer 220 may occur in a PVD chamber where a second plurality of nickel silicide atoms are deposited on the upper surface 225 of the first nickel silicide seed layer 220 as illustrated in FIG. 2C. A plurality of nickel silicide atoms may be deposited using the processing conditions discussed above, such as the first pressure, first RF power, pulsed-DC power, and/or the VHF frequency. In some embodiments, an optional RF power may be applied to the substrate 200 (e.g., to an electrode disposed beneath the substrate 200, such as within the substrate support) during the deposition of the first plurality of nickel silicide atoms 221. The RF power (also referred to as an RF bias power) may be applied at a frequency ranging from about 2 to about 13.56 MHz and at a power of up to about 50 W. In some embodiments, the frequency of the RF bias power may be about 2 MHz, or about 13.56 MHz, or both if another RF power source is additionally coupled a substrate support pedestal of the PVD chamber (or an electrode contained therein). The optional RF bias power provided while depositing the first plurality of nickel silicide atoms 221 may be small to minimize energy of the depositing nickel silicide atoms.

In some embodiments, at 130, a second RF power (also referred to herein as a second RF bias power) is applied to an electrode disposed beneath the substrate 200. The second RF bias power may be applied at a frequency ranging from about 2 to about 13.56 MHz. For example, in some embodiments, the frequency of the first RF bias power may be about 2 MHz, or 13.56 MHz, or both if an optional second RF bias power source (second RF bias power source 363 illustrated in FIG. 3) is additionally coupled a substrate support pedestal 302 as shown in FIG. 3 and described below. The second RF bias power may be utilized to increase ion energy and/or angle of incidence of ions incident on the substrate 200. In some embodiments, where a first RF bias power and a second RF bias power are utilized concurrently (as discussed above), the first RF bias power may be used to control ion energy proximate the substrate 200 and the second RF bias power may be used to control a distribution in the ion energy proximate the substrate 200.

In some embodiments, at 130, the temperature for depositing the second nickel silicide seed layer is room temperature, or about 20° C. to about 25° C., 22° C., 23° C., 24° C., or 25° C.

In some embodiments, at 130, the second nickel silicide layer 240 is formed to a predetermined thickness. In embodiments, the second nickel silicide layer 240 has a thickness of about 30 to 70 percent of total nickel silicide thickness, for example, 50 angstrom out of a total thickness of 100 angstrom nickel silicide film. In embodiments, the second nickel silicide layer 240 has a thickness of about 50 angstroms to 200 angstroms, 50 angstroms to 175 angstroms, 50 angstroms to 150 angstroms, about 50 angstroms, about 60 angstroms, about 70 angstroms, about 80 angstroms, about 100 angstroms, about 125 angstroms, about 150 angstroms, or about 175 angstroms.

After the second nickel silicide layer 240 is formed at 130, the method 100 may end, or the substrate 200 may continue for further processing, for example by depositing a capping layer 260 atop the second nickel silicide layer 240 to fill the opening 202, as depicted in FIG. 2C. The capping layer 260 material may be deposited by any suitable technique such as an in situ technique to prevent oxidation. The material of capping layer 260 may include metals, metal alloys, or the like. In some embodiments, the material comprises one or more of copper (Cu) or tungsten (W) or titanium nitride (TiN). In one embodiment, capping layer 260 comprises TiN deposited atop the second nickel silicide layer 240. Another example of further processing optionally includes a second anneal to the substrate 200. In some embodiments, the second anneal is characterized as ex situ. In embodiments, the second anneal may be performed at a temperature of about 300 to 400 degrees Celsius, such as 350 degrees Celsius, for about 10 minutes, at a pressure of about 20 bar. The second anneal may be performed in, e.g., an annealing chamber. In embodiments, the second anneal is performed in a thermal processing chamber suitable for annealing in an integrated system suitable for maintaining the substrate under vacuum.

In embodiments, the nickel silicide material 250 is formed to have a predetermined sheet resistance. For Example, in embodiments, at a thickness of 10 nanometer, the nickel silicide material 250 has a sheet resistance in the amount of 20 to 50 ohm/square, 20 to 40 ohm/square, 20 to 30 ohm/square, 20 to 30 ohm/square, 20 ohm/square, 21 ohm/square, 22 ohm/square, 23 ohm/square, 24 ohm/square, 25 ohm/square, 26 ohm/square, 27 ohm/square, 28 ohm/square, 29 ohm/square, 30 ohm/square, 35 ohm/square, or 40 ohm/square.

Referring now to FIG. 2D, in some embodiments, and as discussed above with respect to FIG. 2A, a second substrate 218 may have been provided prior to performing 110-130 described above. Accordingly, as illustrated in FIG. 2D, the second substrate 218 may be disposed adjacent to the second surface 206 of the substrate 200, where the opening 202 extends completely through the substrate 200 and the surface 216 of the second substrate 218 forms the bottom surface of the opening 202. Further, a device or conductive feature 234 may be disposed in the second substrate and exposed at the surface 216, wherein the device or conductive feature 234 is aligned with the opening 202. The first surface 204 of the substrate 200 may be further processed to remove deposited nickel silicide atoms. For example, a chemical mechanical polishing technique, etching, or the like may be used to remove deposited nickel silicide atoms from the first surface 204, as illustrated in FIG. 2D.

In some embodiments, after the material 250 has been deposited as described above, material may be removed from the second surface 206 of the substrate 200 to expose at least one the first layer 230 or the deposited nickel silicide material 250 (the first layer 230 is illustrated as being exposed in FIG. 2D). The removal of material from the second surface 206 may be performed by chemical mechanical polishing or similar techniques as described above for the removal of deposited metal from the first surface 204 of the substrate 200.

After the removal of material from the second surface 206 to expose at least one the first layer 230 or the deposited material 232, the second surface 206 of the substrate 200 may be coupled to the surface 216 of the second substrate 218. In some embodiments, the device or conductive feature 234 exposed at the surface 216 of the second substrate 218 may be aligned with the opening 202 in the substrate 200.

FIG. 3 depicts a schematic, cross-sectional view of a physical vapor deposition chamber (process chamber 300) in accordance with some embodiments of the present disclosure. Examples of suitable PVD chambers include the MAGNUM® or ROSWELL® multi-cathode process chambers, ALPS® Plus and SIP ENCORE® PVD process chambers, all commercially available from Applied Materials, Inc., of Santa Clara, California Other process chambers from Applied Materials, Inc. or other manufactures may also benefit from the inventive apparatus disclosed herein.

The process chamber 300 contains a substrate support pedestal 302 for receiving a substrate 304 thereon, and a sputtering source, such as a target 306. The substrate support pedestal 302 may be located within a grounded chamber wall 308, which may be a chamber wall (as shown) or a grounded shield such as a ground shield 340 covering at least some portions of the process chamber 300 above the target 306. In some embodiments, the ground shield 340 could be extended below the target to enclose the substrate support pedestal 302.

In some embodiments, the process chamber includes a feed structure for coupling RF and pulsed-DC energy to the target 306. The feed structure is an apparatus for coupling RF and pulsed-DC energy to the target, or to an assembly containing the target, for example, as described herein. A first end of the feed structure can be coupled to an RF power source 318 and a pulsed-DC power source 320, which can be respectively utilized to provide RF and pulsed-DC energy to the target 306. For example, the DC power source 320 may be utilized to apply a negative voltage, or bias, to the target 306. In some embodiments, RF energy supplied by the RF power source 318 may be suitable to provide frequency as described above, or range in frequency from about 2 MHz to about 60 MHz, or, for example, non-limiting frequencies such as 2 MHz, 13.56 MHz, 27.12 MHz, or 60 MHz can be used. In some embodiments, a plurality of RF power sources may be provided (i.e., two or more) to provide RF energy in a plurality of the above frequencies. The feed structure may be fabricated from suitable conductive materials to conduct the RF and pulsed-DC energy from the RF power source 318 and the pulsed-DC power source 320.

In some embodiments, the feed structure may have a suitable length that facilitates substantially uniform distribution of the respective RF and pulsed-DC energy about the perimeter of the feed structure. For example, in some embodiments, the feed structure may have a length of between about 1 to about 12 inches, or about 4 inches. In some embodiments, the body may have a length to inner diameter ratio of at least about 1:1. Providing a ratio of at least 1:1 or longer provides for more uniform RF delivery from the feed structure (i.e., the RF energy is more uniformly distributed about the feed structure to approximate RF coupling to the true center point of the feed structure. The inner diameter of the feed structure may be as small as possible, for example, from about 1 inch to about 6 inches, or about 4 inches in diameter. Providing a smaller inner diameter facilitates improving the length to ID ratio without increasing the length of the feed structure.

The second end of the feed structure may be coupled to a source distribution plate 322. The source distribution plate includes a hole 324 disposed through the source distribution plate 322 and aligned with a central opening of the feed structure. The source distribution plate 322 may be fabricated from suitable conductive materials to conduct the RF and pulsed-DC energy from the feed structure.

The source distribution plate 322 may be coupled to the target 306 via a conductive member 325. The conductive member 325 may be a tubular member having a first end 326 coupled to a target-facing surface 328 of the source distribution plate 322 proximate the peripheral edge of the source distribution plate 322. The conductive member 325 further includes a second end 330 coupled to a source distribution plate-facing surface 332 of the target 306 (or to the backing plate 346 of the target 306) proximate the peripheral edge of the target 306.

A cavity 334 may be defined by the inner-facing walls of the conductive member 325, the target-facing surface 328 of the source distribution plate 322 and the source distribution plate-facing surface 332 of the target 306. The cavity 334 is fluidly coupled to the central opening 315 of the body via the hole 324 of the source distribution plate 322. The cavity 334 and the central opening 315 of the body may be utilized to at least partially house one or more portions of a rotatable magnetron assembly 336 as illustrated in FIG. 3 and described further below. In some embodiments, the cavity may be at least partially filled with a cooling fluid, such as water (H$_2$O) or the like.

A ground shield 340 may be provided to cover the outside surfaces of the lid of the process chamber 300. The ground shield 340 may be coupled to ground, for example, via the ground connection of the chamber body. The ground shield 340 has a central opening to allow the feed structure to pass through the ground shield 340 to be coupled to the source distribution plate 322. The ground shield 340 may comprise any suitable conductive material, such as aluminum, copper, or the like. An insulative gap 339 is provided between the ground shield 340 and the outer surfaces of the source distribution plate 322, the conductive member 325, and the target 306 (and/or backing plate 346) to prevent the RF and pulsed-DC energy from being routed directly to ground. The insulative gap may be filled with air or some other suitable dielectric material, such as a ceramic, a plastic, or the like.

In some embodiments, a ground collar may be disposed about the body and lower portion of the feed structure. The ground collar is coupled to the ground shield 340 and may be an integral part of the ground shield 340 or a separate part coupled to the ground shield to provide grounding of the feed structure. The ground collar may be made from a suitable conductive material, such as aluminum or copper. In some embodiments, a gap disposed between the inner diameter of the ground collar and the outer diameter of the body of the feed structure may be kept to a minimum and be just enough to provide electrical isolation. The gap can be filled with isolating material like plastic or ceramic or can be an air gap. The ground collar prevents cross-talk between the RF feed (e.g., electrical feed 205, discussed below) and the body, thus improving plasma, and processing, uniformity.

An isolator plate 338 may be disposed between the source distribution plate 322 and the ground shield 340 to prevent the RF and pulsed-DC energy from being routed directly to ground. The isolator plate 338 has a central opening to allow the feed structure to pass through the isolator plate 338 and be coupled to the source distribution plate 322. The isolator plate 338 may comprise a suitable dielectric material, such as a ceramic, a plastic, or the like. Alternatively, an air gap may be provided in place of the isolator plate 338. In embodiments where an air gap is provided in place of the isolator plate, the ground shield 340 may be structurally sound enough to support any components resting upon the ground shield 340.

The target 306 may be supported on a grounded conductive aluminum adapter such as 342 through a dielectric isolator 344. The target 306 comprises a material to be deposited on the substrate 304 during sputtering, such a nickel silicide. In some embodiments, the backing plate 346 may be coupled to the source distribution plate-facing surface 332 of the target 306. The backing plate 346 may comprise a conductive material, such as nickel silicide, or the same material as the target, such that RF and pulsed-DC power can be coupled to the target 306 via the backing plate 346. Alternatively, the backing plate 346 may be non-conductive and may include conductive elements (not shown) such as electrical feedthroughs or the like for coupling the source distribution plate-facing surface 332 of the target 306 to the second end 330 of the conductive member 325. The backing plate 346 may be included for example, to improve structural stability of the target 306.

The substrate support pedestal 302 has a material-receiving surface facing the principal surface of the target 306 and supports the substrate 304 to be sputter coated in planar position opposite to the principal surface of the target 306. The substrate support pedestal 302 may support the substrate 304 in a central region 348 of the process chamber 300. The central region 348 is defined as the region above the substrate support pedestal 302 during processing (for example, between the target 306 and the substrate support pedestal 302 when in a processing position).

In some embodiments, the substrate support pedestal 302 may be vertically movable through a bellows 350 connected to a bottom chamber wall 352 to allow the substrate 304 to be transferred onto the substrate support pedestal 302 through a load lock valve (not shown) in the lower portion of the process chamber 300 and thereafter raised to a deposition, or processing position. One or more processing gases may be supplied from a gas source 354 through a mass flow controller 356 into the lower part of the process chamber 300. An exhaust port 358 may be provided and coupled to a pump (not shown) via a valve 360 for exhausting the interior of the process chamber 300 and facilitating maintaining a desired pressure inside the process chamber 300.

An RF bias power source 362 may be coupled to the substrate support pedestal 302 in order to induce a negative DC bias on the substrate 304. In addition, in some embodiments, a negative DC self-bias may form on the substrate 304 during processing. For example, RF power supplied by the RF bias power source 362 may range in frequency from about 2 MHz to about 60 MHz, for example, non-limiting frequencies such as 2 MHz, 13.56 MHz, or 60 MHz can be used. Further, a second RF bias power source may be coupled to the substrate support pedestal 302 and provide any of the frequencies discussed above for use with the RF bias power source 362. In other applications, the substrate support pedestal 302 may be grounded or left electrically floating. For example, a capacitance tuner 364 may be coupled to the substrate support pedestal for adjusting voltage on the substrate 304 for applications where RF bias power may not be desired.

A rotatable magnetron assembly 336 may be positioned proximate a back surface (e.g., source distribution plate-facing surface 332) of the target 306. The rotatable magnetron assembly 336 includes a plurality of magnets 366 supported by a base plate 368. The base plate 368 connects to a rotation shaft 370 coincident with the central axis of the process chamber 300 and the substrate 304. A motor 372 can be coupled to the upper end of the rotation shaft 370 to drive rotation of the magnetron assembly 336. The magnets 366 produce a magnetic field within the process chamber 300, generally parallel and close to the surface of the target 306 to trap electrons and increase the local plasma density, which in turn increases the sputtering rate. The magnets 366 produce an electromagnetic field around the top of the process chamber 300, and magnets 366 are rotated to rotate the electromagnetic field which influences the plasma density of the process to more uniformly sputter the target 306. For example, the rotation shaft 370 may make about 0 to about 150 rotations per minute.

In some embodiments, the process chamber 300 may further include a process kit shield 374 connected to a ledge 376 of the adapter 342. The adapter 342 in turn is sealed and grounded to the aluminum chamber sidewall such as chamber wall 308. Generally, the process kit shield 374 extends downwardly along the walls of the adapter 342 and the chamber wall 308 downwardly to below an upper surface of the substrate support pedestal 302 and returns upwardly until reaching an upper surface of the substrate support pedestal 302 (e.g., forming a u-shaped portion 384 at the bottom). Alternatively, the bottommost portion of the process kit shield need not be a u-shaped portion 384 and may have any suitable shape. A cover ring 386 rests on the top of an upwardly extending lip 388 of the process kit shield 374 when the substrate support pedestal 302 is in a lower, loading position but rests on the outer periphery of the substrate support pedestal 302 when the substrate support pedestal 302 is in an upper, deposition position to protect the substrate support pedestal 302 from sputter deposition. An additional deposition ring (not shown) may be used to shield the periphery of the substrate 304 from deposition. Embodiments of a process kit shield are discussed below in accordance with the present disclosure.

In some embodiments, a magnet 390 may be disposed about the process chamber 300 for selectively providing a magnetic field between the substrate support pedestal 302 and the target 306. For example, as shown in FIG. 3, the magnet 390 may be disposed about the outside of the chamber wall 308 in a region just above the substrate support pedestal 302 when in processing position. In some embodiments, the magnet 390 may be disposed additionally or alternatively in other locations, such as adjacent the adapter 342. The magnet 390 may be an electromagnet and may be coupled to a power source (not shown) for controlling the magnitude of the magnetic field generated by the electromagnet.

A controller 310 may be provided and coupled to various components of the process chamber 300 to control the operation thereof. The controller 310 includes a central processing unit (CPU) 312, a memory 314, and support circuits 316. The controller 310 may control the process chamber 300 directly, or via computers (or controllers) associated with particular process chamber and/or support system components. The controller 310 may be one of any form of general-purpose computer processor that can be used in an industrial setting for controlling various chambers and sub-processors. The memory, or computer readable medium, 434 of the controller 310 may be one or more of readily available memory such as random access memory (RAM), read only memory (ROM), floppy disk, hard disk, optical storage media (e.g., compact disc or digital video disc), flash drive, or any other form of digital storage, local or remote. The support circuits 316 are coupled to the CPU 312 for supporting the processor in a conventional manner. These circuits include cache, power supplies, clock circuits, input/output circuitry and subsystems, and the like. Inventive methods as described herein may be stored in the memory 314 as software routine that may be executed or invoked to control the operation of the process chamber 300 in the manner described herein. The software routine may also be stored and/or executed by a second CPU (not shown) that is remotely located from the hardware being controlled by the CPU 312.

In some embodiments, the present disclosure relates to a physical vapor deposition chamber configured for forming a nickel silicide material on a substrate. For example, in embodiments, a physical vapor deposition chamber is configured for depositing a first nickel silicide seed layer atop a substrate at a temperature of about 15° C. to about 27° C.; and/or depositing a second nickel silicide layer atop the first nickel silicide seed layer at a temperature of about 15° C. to about 27° C. to form the nickel silicide material.

Thus, methods for depositing metals in high aspect ratio features formed on substrates have been provided herein. The inventive methods advantageously provide continuous coverage of surfaces of the high aspect ratio feature with metal while reducing overhangs or facets that can cause void formation in high aspect ratio features. The inventive methods may be utilized with through silicon via (TSV) applications, for example, for either via first or via last methods of fabrication, as well as other suitable applications where depositing a continuous metal layer may be advantageous.

Figure 4:
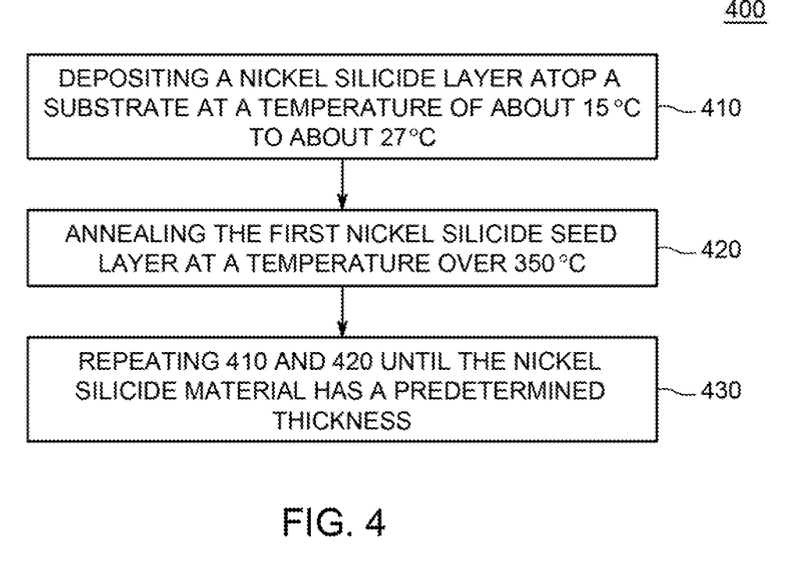
FIG. 4 depicts a flow chart of a method for processing a substrate in accordance with some embodiments of the present disclosure.

Referring now to FIG. 4, a method 400 of lowering resistivity of a nickel silicide material is shown. Method 400 includes a) depositing at 410 a nickel silicide layer atop a substrate at a temperature of about 15° C. to about 27° C.; b) at 420 annealing the first nickel silicide seed layer at a temperature over 350° C., or in embodiments, 400 degrees Celsius or less; and c) at 430 repeating a) (410) and b) (420) until the nickel silicide material has a predetermined thickness. In embodiments, the process conditions are the same as those described above with respect to method 100. In embodiments, the substrate may be further processed such as by depositing a TiN capping layer atop the second nickel silicide layer. In embodiments, the temperature for depositing the nickel silicide layer is about 20° C. to about 25° C., 22° C., 23° C., 24° C., or 25° C. In embodiments, the nickel silicide seed layer has a thickness of about 20 angstroms to 60 angstroms, about 30 angstroms to 50 angstroms, about 35 angstroms to 45 angstroms, about 20 angstroms, about 25 angstroms, about 30 angstroms, about 35 angstroms, about 40 angstroms, about 50 angstroms, about 60 angstroms. In some embodiments, the first nickel silicide seed layer and the second nickel silicide layer is deposited by exposing the substrate to nickel silicide in a physical vapor deposition process. In embodiments, the first nickel silicide seed layer and the second nickel silicide layer are formed using a physical vapor deposition process comprising a nickel and silicon target, the target having a nickel and silicon ratio of about 1:1. In some embodiments, the nickel silicide material has a sheet resistance in the amount of 20 to 50 ohm/square, 20 to 40 ohm/square, 20 to 30 ohm/square, 20 to 35 ohm/square, 20 ohm/square, 20 ohm/square, 21 ohm/square, 22 ohm/square, 23 ohm/square, 24 ohm/square, 25 ohm/square, 26 ohm/square, 27 ohm/square, 28 ohm/square, 29 ohm/square, 30 ohm/square, 35 ohm/square, or 40 ohm/square.

In some embodiments, the present disclosure relates to a physical vapor deposition chamber configured for lowering resistivity of a nickel silicide material. For example, in embodiments, a physical vapor deposition chamber is configured for depositing a nickel silicide layer atop a substrate at a temperature of about 15° C. to about 27° C. until the nickel silicide material has a predetermined thickness.

Figure 5:
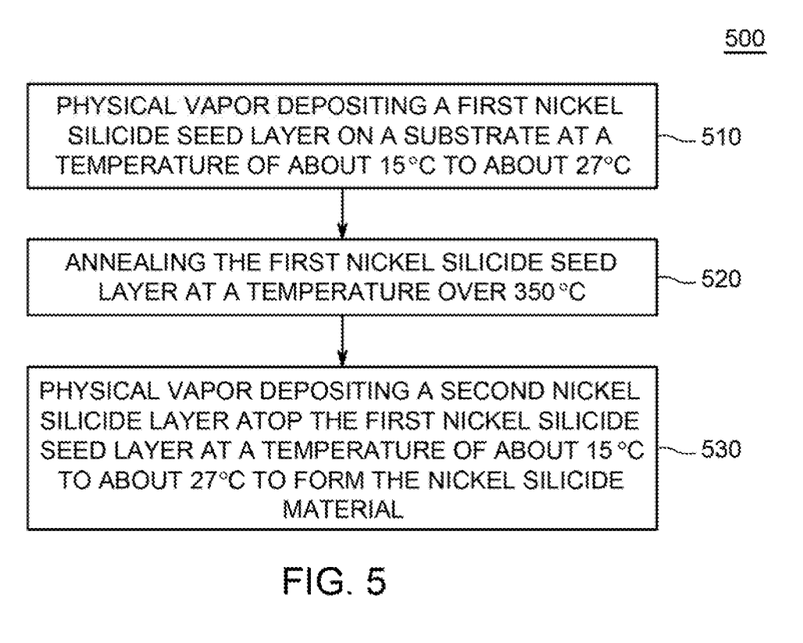
FIG. 5 depicts a flow chart of a method of forming an interconnection on a substrate in accordance with some embodiments of the present disclosure.

Referring now to FIG. 5, a method 500 of forming an interconnection on a substrate, is shown. Embodiments include, at 510, physical vapor depositing a first nickel silicide seed layer on a substrate at a temperature of about 15° C. to about 27° C.; annealing 520 the first nickel silicide seed layer at a temperature over 350° C.; and physical vapor depositing 530 a second nickel silicide layer atop the first nickel silicide seed layer at a temperature of about 15° C. to about 27° C. to form the nickel silicide material. In some embodiments, physical vapor depositing a first nickel silicide seed layer on a substrate at a temperature of about 15° C. to about 27° C.; annealing 520 the first nickel silicide seed layer at a temperature of 400° C. or less; and physical vapor depositing 530 a second nickel silicide layer atop the first nickel silicide seed layer at a temperature of about 15° C. to about 27° C. to form the nickel silicide material.

In some embodiments, the present disclosure relates to a physical vapor deposition chamber configured for forming an interconnection on a substrate. For example, in embodiments, a physical vapor deposition chamber is configured for physical vapor depositing a first nickel silicide seed layer on a substrate at a temperature of about 15° C. to about 27° C. and/or physical vapor depositing a second nickel silicide layer atop the first nickel silicide seed layer at a temperature of about 15° C. to about 27° C. to form a nickel silicide material.

Figure 6:
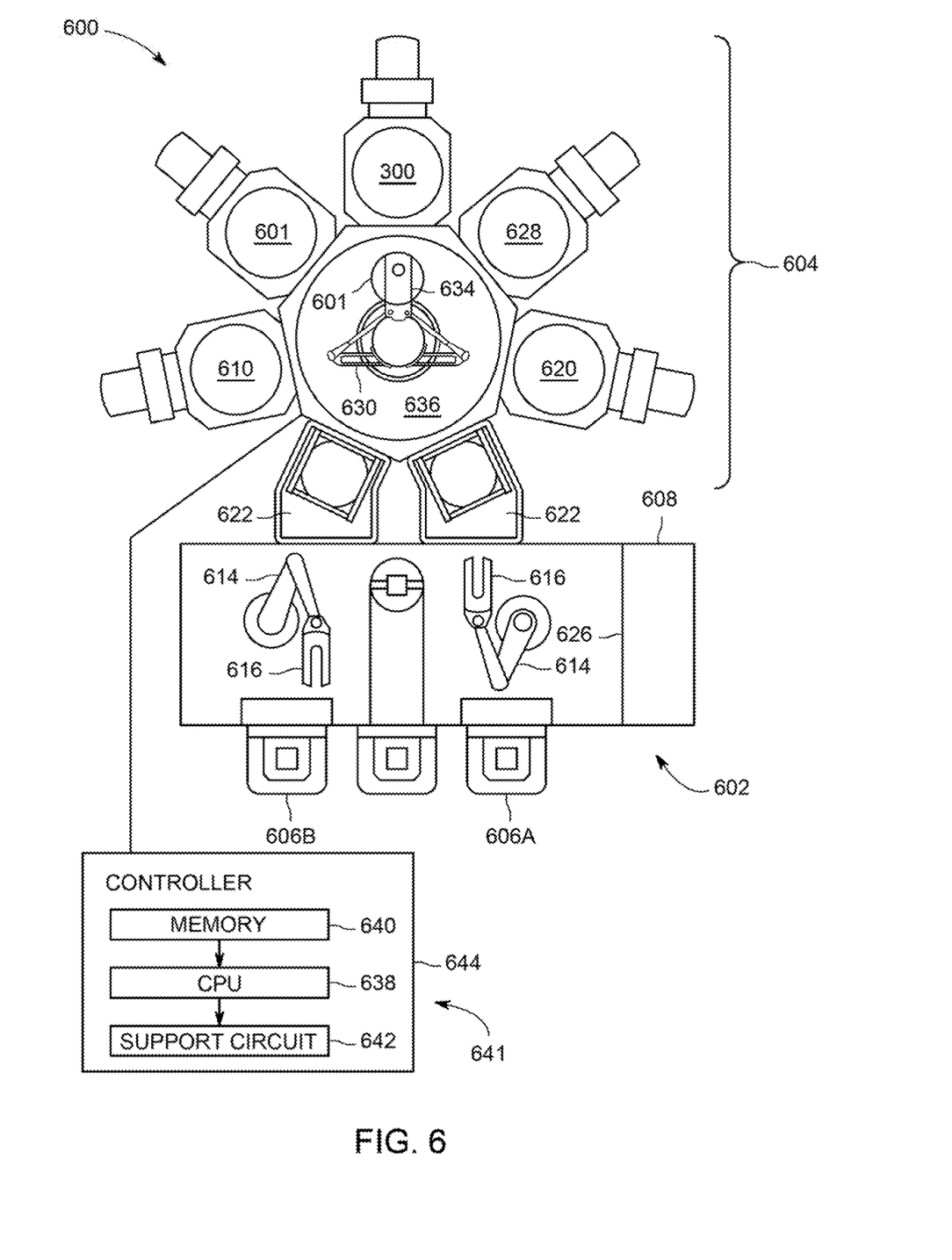
FIG. 6 depicts a top plan view of a processing tool including the apparatus of FIG. 3 in accordance with some embodiments of the present disclosure.

FIG. 6 is a schematic, top plan view of an exemplary integrated system 600 that includes at least one deposition processing chamber 300, such as a process chamber configured in accordance with the present disclosure. In some embodiments, the integrated system 600 may be a CENTURA® integrated processing system, commercially available from Applied Materials, Inc., located in Santa Clara, CA Other processing systems (including those from other manufacturers) may be adapted to benefit from the disclosure.

In some embodiments, the integrated system 600 includes a vacuum-tight processing platform such as processing platform 604, a factory interface 602, and a system controller 644. The processing platform 604 includes at least one deposition processing chamber 300, at least one thermal processing chamber 601 configured for annealing in accordance with the present disclosure, and optionally a plurality of processing chambers 628, 620, 610 and at least one load lock chamber 622 that is coupled to a vacuum substrate transfer chamber such as transfer chamber 636. Two load lock chambers 622 are shown in FIG. 6. The factory interface 602 is coupled to the transfer chamber 636 by the load lock chambers 622.

In one embodiment, the factory interface 602 comprises at least one docking station 608 and at least one factory interface robot 614 to facilitate transfer of substrates. The docking station 608 is configured to accept one or more front opening unified pod (FOUP). Two FOUPS 606A-B are shown in the embodiment of FIG. 6. The factory interface robot 614, having a blade 616 disposed on one end of the factory interface robot 614, is configured to transfer the substrate from the factory interface 602 to the processing platform 604 for processing through the load lock chambers 622. Optionally, one or more processing chambers 610, 620, 628, at least one deposition processing chamber 300, at least one thermal processing chamber 601 configured for annealing in accordance with the present disclosure may be connected to a terminal 626 of the factory interface 602 to facilitate processing of the substrate from the FOUPS 606A-B.

Each of the load lock chambers 622 have a first port coupled to the factory interface 602 and a second port coupled to the transfer chamber 636. The load lock chambers 622 are coupled to a pressure control system (not shown) which pumps down and vents the load lock chambers 622 to facilitate passing the substrate between the vacuum environment of the transfer chamber 636 and the substantially ambient (e.g., atmospheric) environment of the factory interface 602.

The transfer chamber 636 has a vacuum robot 630 disposed therein. The vacuum robot 630 has a blade 634 capable of transferring substrates among the load lock chambers 622, the at least one deposition processing chamber 300, at least one thermal processing chamber 601 configured for annealing in accordance with the present disclosure, and the processing chambers 610, 620, and 628.

In some embodiments of the integrated system 600, the integrated system 600 may include at least one deposition processing chamber 300, and other processing chambers 610, 620, 628, at least one thermal processing chamber 601 configured for annealing in accordance with the present disclosure. In some embodiments, processing chambers 610, 620, 628 may be a deposition chamber, etch chamber, thermal processing chamber or other similar type of semiconductor processing chamber.

The system controller 644 is coupled to the integrated system 600. The system controller 644, which may include the computing device 641 or be included within the computing device 641, controls the operation of the integrated system 600 using a direct control of the processing chambers 610, 620, 628, at least one deposition processing chamber 300, at least one thermal processing chamber 601 configured for annealing in accordance with the present disclosure of the integrated system 600. Alternatively, the system controller 644 may control the computers (or controllers) associated with the processing chambers 610, 620, 628, least one deposition processing chamber 300, at least one thermal processing chamber 601 configured for annealing in accordance with the present disclosure and the integrated system 600. In operation, the system controller 644 also enables data collection and feedback from the respective chambers and the processing chambers such as at least one deposition processing chamber 300, at least one thermal processing chamber 601 configured for annealing in accordance with the present disclosure to optimize performance of the integrated system 600.

The system controller 644 generally includes a central processing unit (CPU) 638, a memory 640, and support circuits 642. The CPU 638 may be one of any form of a general purpose computer processor that can be used in an industrial setting. The support circuits 642 are conventionally coupled to the CPU 638 and may comprise cache, clock circuits, input/output subsystems, power supplies, and the like. The software routines transform the CPU 638 into a specific purpose computer (system controller) 644. The software routines may also be stored and/or executed by a second controller (not shown) that is located remotely from the integrated system 600. The memory, or computer-readable medium of a CPU may be included including one or more of readily available memory such as random access memory (RAM), read only memory (ROM), floppy disk, hard disk, or any other form of digital storage, local or remote.

In some embodiments, the present disclosure includes an integrated system including: a vacuum substrate transfer chamber; at least one deposition processing chamber configured to deposit in accordance with the present disclosure, at least one thermal processing chamber configured for annealing in accordance with the present disclosure, wherein the integrated system is configured to move a substrate from the at least one deposition processing chamber configured to deposit in accordance with the present disclosure to the at least one thermal processing chamber configured for annealing in accordance with the present disclosure under vacuum. In some embodiments, the present disclosure relates to a substrate processing system, including: a physical vapor depositing chamber configured for physical vapor depositing a first nickel silicide seed layer on a substrate at a temperature of about 15° C. to about 27° C., and physical vapor depositing a second nickel silicide layer atop the first nickel silicide seed layer at a temperature of about 15° C. to about 27° C. to form a nickel silicide material; and a thermal processing chamber configured for annealing the first nickel silicide seed layer at a temperature over 350° C. In some embodiments, the substrate processing system further includes a vacuum substrate transfer chamber, wherein the physical vapor depositing chamber is coupled to the vacuum substrate transfer chamber; and a thermal processing chamber coupled to the vacuum substrate transfer chamber, wherein the substrate processing system is configured to move a substrate from the physical vapor depositing chamber to the thermal processing chamber under vacuum.

In some embodiments, the present disclosure includes a computer readable medium, having instructions stored thereon which, when executed, cause an integrated system to perform a method of forming a nickel silicide material on a substrate including: depositing a first nickel silicide seed layer atop a substrate at a temperature of about 15° C. to about 27° C.; annealing the first nickel silicide seed layer at a temperature over 350° C.; and depositing a second nickel silicide layer atop the first nickel silicide seed layer at a temperature of about 15° C. to about 27° C. to form the nickel silicide material.

In some embodiments, the present disclosure includes a computer readable medium, having instructions stored thereon which, when executed, cause an integrated system to perform a method of lowering resistivity of a nickel silicide material including: a) depositing a nickel silicide layer atop a substrate at a temperature of about 15° C. to about 27° C.; b) annealing the nickel silicide layer at a temperature over 350° C.; and c) repeating a) and b) until the nickel silicide material has a predetermined thickness.

In some embodiments, the present disclosure includes a computer readable medium, having instructions stored thereon which, when executed, cause an integrated system to perform a method of forming an interconnection on a substrate, including: physical vapor depositing a first nickel silicide seed layer on a substrate at a temperature of about 15° C. to about 27° C.; annealing the first nickel silicide seed layer at a temperature over 350° C.; and physical vapor depositing a second nickel silicide layer atop the first nickel silicide seed layer at a temperature of about 15° C. to about 27° C. to form a nickel silicide material.

While the foregoing is directed to embodiments of the present disclosure, other and further embodiments of the disclosure may be devised without departing from the basic scope thereof.

The invention claimed is:

1. A method for forming a nickel silicide material on a substrate comprising:
   depositing a first nickel silicide seed layer atop a substrate at a temperature of about 15° C. to about 27° C.;
   annealing the first nickel silicide seed layer at a temperature over 350° C. for a duration sufficient to increase a grain size of a seed grain of the first nickel silicide seed layer to at least 200 nm, wherein depositing the first nickel silicide seed layer and annealing the first nickel silicide seed layer are performed without vacuum break between depositing the first nickel silicide seed layer and annealing the first nickel silicide seed layer; and
   after annealing the first nickel silicide seed layer, depositing a second nickel silicide layer atop the first nickel silicide seed layer at a temperature of about 15° C. to about 27° C. to form the nickel silicide material,
   wherein the first nickel silicide seed layer and the second nickel silicide layer are deposited by a physical vapor deposition process.

2. The method of claim 1, further comprising annealing the nickel silicide material.

3. The method of claim 1, further comprising depositing a titanium nitride (TiN) capping layer atop the second nickel silicide layer.

4. The method of claim 1, wherein the temperature for depositing at least one of the first nickel silicide seed layer or the second nickel silicide layer is about 20° C. to about 25° C.

5. The method of claim 1, wherein at least one of the first nickel silicide seed layer has a thickness of about 20 angstroms to 60 angstroms or the second nickel silicide layer has a thickness of about 50 angstroms to 200 angstroms.

6. The method of claim 1, wherein the first nickel silicide seed layer and the second nickel silicide layer are formed using a physical vapor deposition process comprising a nickel and silicon target, wherein the nickel and silicon target has a nickel and silicon ratio of about 1:1.

7. The method of claim 1, wherein the nickel silicide material has a sheet resistance in an amount of about 20 to 50 ohm per square.

8. The method of claim 1, wherein annealing the first nickel silicide seed layer is at a temperature of about 355° C. to 450° C.

9. The method of claim 1, wherein depositing the first nickel silicide seed layer and annealing the first nickel silicide seed layer are performed in a single integrated system.

10. The method of claim 1, wherein
depositing the first nickel silicide seed layer is performed in a first chamber, and
annealing the first nickel silicide seed layer is performed in a second chamber different from the first chamber, and
further comprising transferring the substrate between the first chamber and the second chamber under vacuum.

11. A method of lowering resistivity of a nickel silicide material comprising:
a) depositing a nickel silicide layer atop a substrate at a temperature of about 15° C. to about 27° C., wherein the nickel silicide layer is deposited by a physical vapor deposition process;
b) after depositing the nickel silicide layer, annealing the nickel silicide layer at a temperature over 350° C. for a duration sufficient to increase a grain size of a seed grain of the nickel silicide layer to at least 200 nm, wherein depositing the nickel silicide layer and annealing the nickel silicide layer are performed without vacuum break between depositing the nickel silicide layer and annealing the nickel silicide layer; and
c) after annealing the nickel silicide layer, repeating a) and b) until the nickel silicide material has a predetermined thickness.

12. The method of claim 11, further comprising depositing a titanium nitride (TiN) capping layer atop the nickel silicide material.

13. The method of claim 11, wherein the temperature for depositing the nickel silicide layer is about 20° C. to about 25° C.

14. The method of claim 11, wherein the nickel silicide layer has a thickness of about 20 angstroms to 60 angstroms.

15. The method of claim 11, wherein the nickel silicide layer is deposited by exposing the substrate to nickel silicide in a physical vapor deposition process.

16. The method of claim 11, wherein the nickel silicide layer is formed using a physical vapor deposition process comprising a nickel and silicon target, wherein the nickel and silicon target has a nickel and silicon ratio of about 1:1.

17. The method of claim 11, wherein the nickel silicide material has a sheet resistance in an amount of 20 to 50 ohm per square.

18. A substrate processing system, comprising:
a physical vapor depositing chamber configured for physical vapor depositing a first nickel silicide seed layer on a substrate at a temperature of about 15° C. to about 27° C., and physical vapor depositing a second nickel silicide layer atop the first nickel silicide seed layer at a temperature of about 15° C. to about 27° C. to form a nickel silicide material; and
a thermal processing chamber configured for annealing the first nickel silicide seed layer, independently of the second nickel silicide layer, at a temperature over 350° C. for a duration sufficient to increase a grain size of a seed grain of the first nickel silicide seed layer to at least 200 nm, wherein depositing the first nickel silicide seed layer and annealing the first nickel silicide seed layer are performed without vacuum break between depositing the first nickel silicide seed layer and annealing the first nickel silicide seed layer.

19. The substrate processing system of claim 18, further comprising:
a vacuum substrate transfer chamber, wherein the physical vapor depositing chamber is coupled to the vacuum substrate transfer chamber; and
a thermal processing chamber coupled to the vacuum substrate transfer chamber, wherein the substrate processing system is configured to move a substrate from the physical vapor depositing chamber to the thermal processing chamber under vacuum.

* * * * *